(12) United States Patent
Radosavljevic et al.

(10) Patent No.: US 8,785,909 B2
(45) Date of Patent: Jul. 22, 2014

(54) NON-PLANAR SEMICONDUCTOR DEVICE HAVING CHANNEL REGION WITH LOW BAND-GAP CLADDING LAYER

(71) Applicants: Marko Radosavljevic, Beaverton, OR (US); Gilbert Dewey, Hillsboro, OR (US); Benjamin Chu-Kung, Hillsboro, OR (US); Dipanjan Basu, Hillsboro, OR (US); Sanaz K. Gardner, Portland, OR (US); Satyarth Suri, Hillsboro, OR (US); Ravi Pillarisetty, Portland, OR (US); Niloy Mukherjee, Beaverton, OR (US); Han Wui Then, Portland, OR (US); Robert S. Chau, Beaverton, OR (US)

(72) Inventors: Marko Radosavljevic, Beaverton, OR (US); Gilbert Dewey, Hillsboro, OR (US); Benjamin Chu-Kung, Hillsboro, OR (US); Dipanjan Basu, Hillsboro, OR (US); Sanaz K. Gardner, Portland, OR (US); Satyarth Suri, Hillsboro, OR (US); Ravi Pillarisetty, Portland, OR (US); Niloy Mukherjee, Beaverton, OR (US); Han Wui Then, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/629,148

(22) Filed: Sep. 27, 2012

(65) Prior Publication Data
US 2014/0084239 A1    Mar. 27, 2014

(51) Int. Cl.
*H01L 29/06* (2006.01)
*B82Y 10/00* (2011.01)
*H01L 29/78* (2006.01)

(52) U.S. Cl.
CPC .......... *H01L 29/0665* (2013.01); *H01L 29/785* (2013.01); *B82Y 10/00* (2013.01)
USPC ...................................................... 257/24

(58) Field of Classification Search
CPC  B82Y 10/00; H01L 29/0665; H01L 29/0873; H01L 29/785
USPC ........... 257/12, 19, 24, 76; 977/816, 825, 936
See application file for complete search history.

(56) References Cited

U.S. PATENT DOCUMENTS 7,727,830 B2 *  6/2010  Jin et al. ....................... 438/197

(Continued)

OTHER PUBLICATIONS

Lauhon et al., "Epitaxial core-shell and core-multishell nanowire heterostructure", 2002, Nature, vol. 420, pp. 57-61, Nov. 2002.*
Dong et al., "Coaxial Group III—Nitride Nanowire Photovoltaics", 2009, Nano Letters, vol. 9, No. 5, pp. 2183-2187, May 2009.*

(Continued)

*Primary Examiner* — Nikolay Yushin
(74) *Attorney, Agent, or Firm* — Blakely, Sokoloff, Taylor & Zafman LLP

(57) ABSTRACT

Non-planar semiconductor devices having channel regions with low band-gap cladding layers are described. For example, a semiconductor device includes a vertical arrangement of a plurality of nanowires disposed above a substrate. Each nanowire includes an inner region having a first band gap and an outer cladding layer surrounding the inner region. The cladding layer has a second, lower band gap. A gate stack is disposed on and completely surrounds the channel region of each of the nanowires. The gate stack includes a gate dielectric layer disposed on and surrounding the cladding layer and a gate electrode disposed on the gate dielectric layer. Source and drain regions are disposed on either side of the channel regions of the nanowires.

31 Claims, 11 Drawing Sheets

(56) References Cited

U.S. PATENT DOCUMENTS

| | | | |
|---|---|---|---|
| 7,821,061 B2* | 10/2010 | Jin et al. | 257/331 |
| 8,110,471 B2 | 2/2012 | Lee et al. | |
| 2006/0214156 A1* | 9/2006 | Pan et al. | 257/40 |
| 2006/0289761 A1* | 12/2006 | Nabet et al. | 250/336.1 |
| 2010/0096704 A1 | 4/2010 | Lin et al. | |
| 2011/0108803 A1* | 5/2011 | Deligianni et al. | 257/24 |
| 2011/0133166 A1* | 6/2011 | Bangsaruntip et al. | 257/24 |
| 2011/0169012 A1* | 7/2011 | Hersee et al. | 257/76 |
| 2012/0007051 A1 | 1/2012 | Bangsaruntip et al. | |
| 2012/0138888 A1 | 6/2012 | Chang et al. | |

OTHER PUBLICATIONS

Tomioka, Katsuhiro, et al., "Vertical $In_{0.7}Ga_{0.3}$as Nanowire Surrounding-Gate Transistors with High-$k$ Gate Dielectric on Si Substrate", IEEE, IEDM 2011, 978-1-4577-050-2/11, 4 pgs.

International Search Report and Written Opinion from PCT Patent Application No. PCT/US2013/045238, mailed Nov. 18, 2013, 10 pgs.

Fang, W. W., et al., "Vertically Stacked SiGe Nanowire Array Channel CMOS Transistors", IEEE Electron Device Letters, Mar. 2007, vol. 28, Issue No. 3, ISSN 0741-3106, 3 pgs.

\* cited by examiner

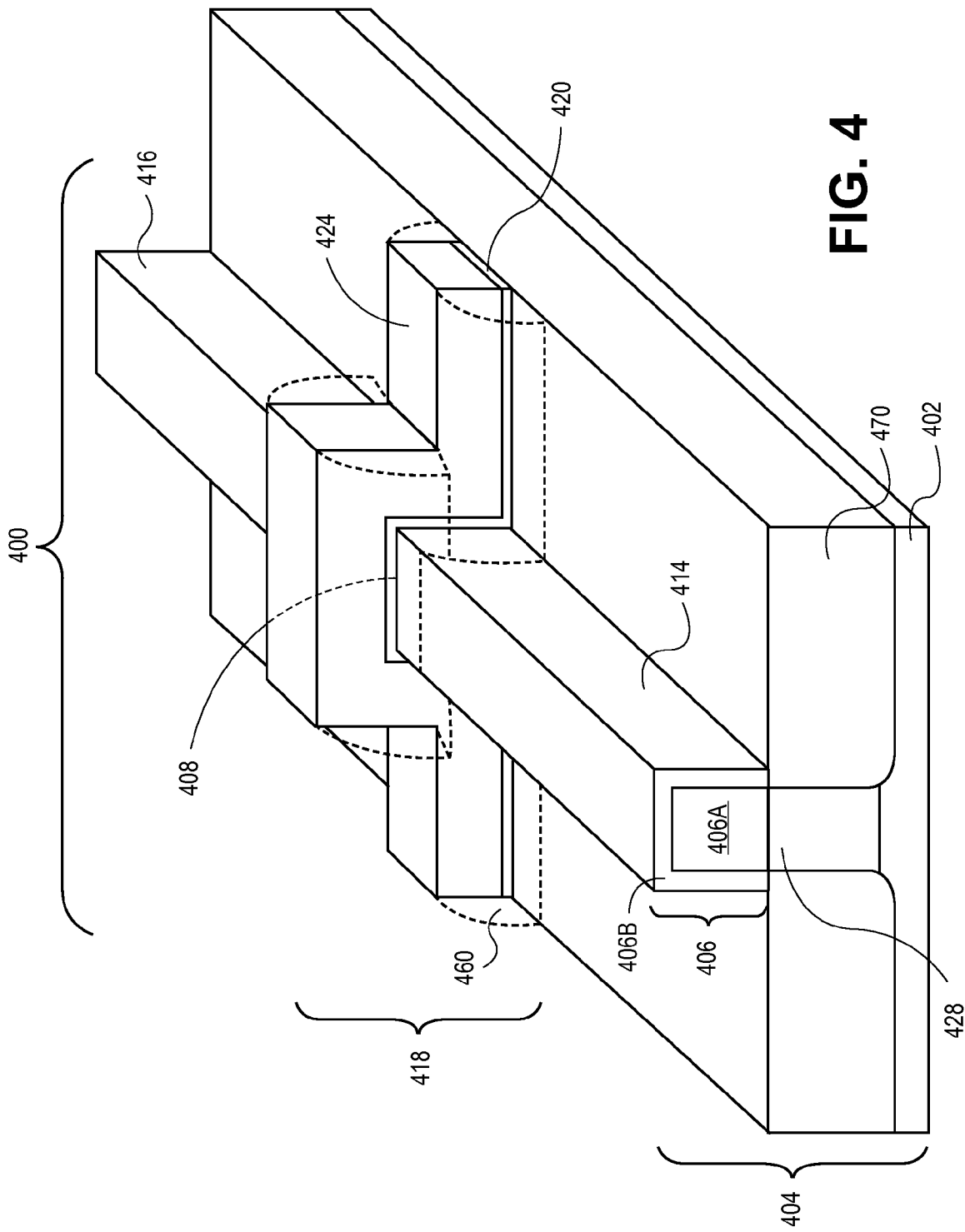

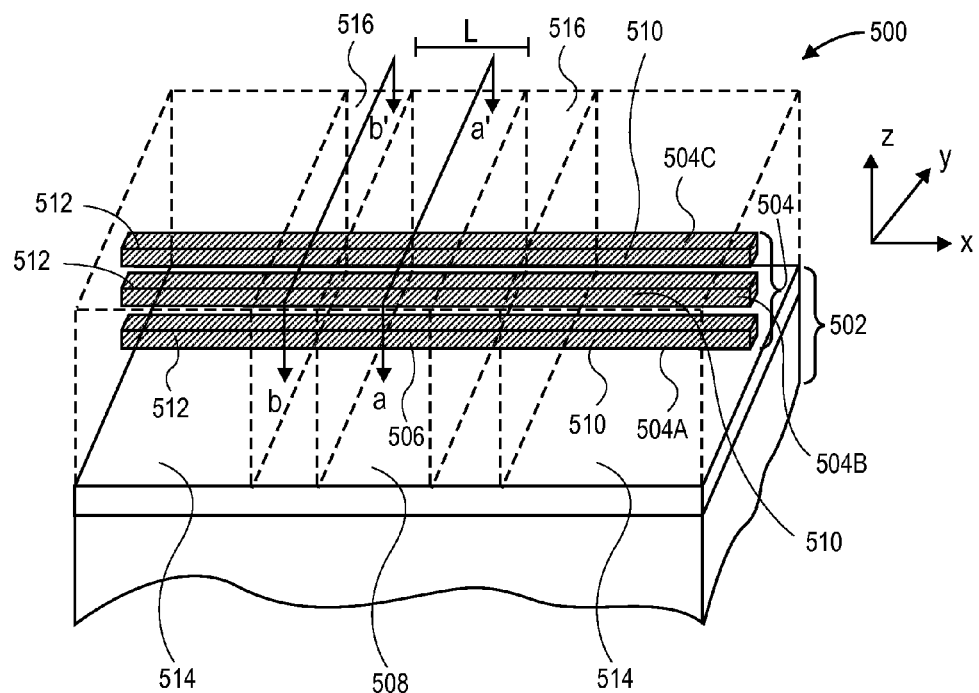
FIG. 5A
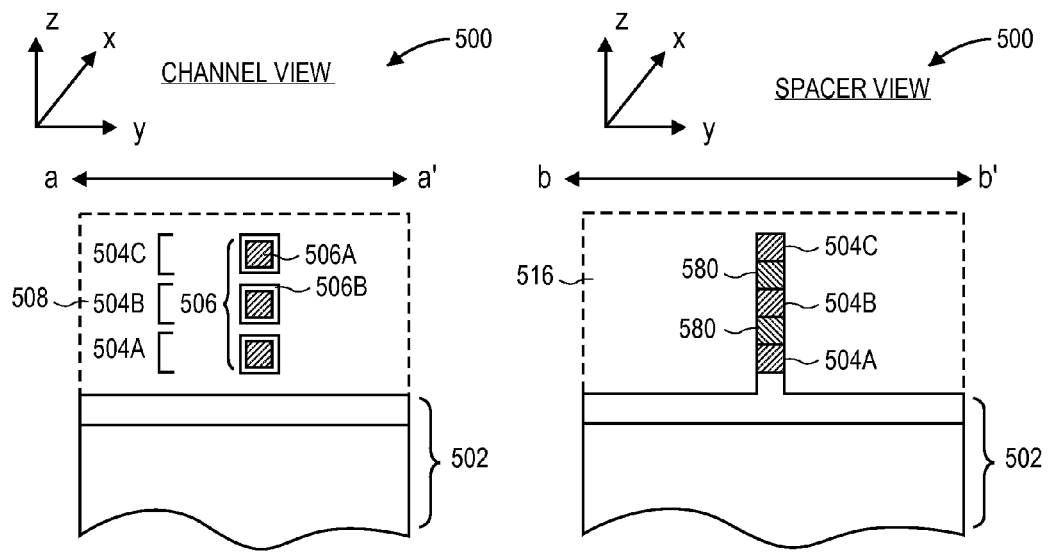
FIG. 5B          FIG. 5C

US 8,785,909 B2

NON-PLANAR SEMICONDUCTOR DEVICE HAVING CHANNEL REGION WITH LOW BAND-GAP CLADDING LAYER

TECHNICAL FIELD

Embodiments of the invention are in the field of semiconductor devices and, in particular, non-planar semiconductor devices having channel regions with low band-gap cladding layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from group III-V material systems offer exceptionally high carrier mobility in the transistor channels due to low effective mass along with reduced impurity scattering. Such devices provide high drive current performance and appear promising for future low power, high speed logic applications. However, significant improvements are still needed in the area of group III-V material-based devices.

Additionally, in the manufacture of integrated circuit devices, multi-gate transistors, such as tri-gate transistors, or gate-all-around devices, such as nanowires, have become more prevalent as device dimensions continue to scale down. Many different techniques have been attempted to reduce junction leakage of such transistors. However, significant improvements are still needed in the area of junction leakage suppression.

BRIEF DESCRIPTION OF THE DRAWINGS

FIG. 4 illustrates an angled view of a non-planar semiconductor device having a channel region with a low band-gap cladding layer, in accordance with an embodiment of the present invention.

FIG. 5A illustrates a three-dimensional cross-sectional view of a nanowire-based semiconductor structure having one or more channel regions with a low band-gap cladding layer, in accordance with an embodiment of the present invention.

FIG. 5B illustrates a cross-sectional channel view of the nanowire-based semiconductor structure of FIG. 5A, as taken along the a-a' axis, in accordance with an embodiment of the present invention.

FIG. 5C illustrates a cross-sectional spacer view of the nanowire-based semiconductor structure of FIG. 5A, as taken along the b-b' axis, in accordance with an embodiment of the present invention.

DESCRIPTION OF THE EMBODIMENTS

Non-planar semiconductor devices having channel regions with low band-gap cladding layers are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to a non-planar semiconductor device having a channel region with a low band-gap cladding layer. In one such embodiment, a gate stack of the device fully surrounds a channel region (such as a nanowire or gate-all-around device), and the cladding layer is included at the entire perimeter of the channel region. In another such embodiment, the a gate stack of the device only partially surrounds a channel region (such as a tri-gate or fin-fet device), and the cladding layer is included at only a portion of the perimeter of the channel region. Such cladding layers may be included to reduce off-state parasitic leakage of the associated semiconductor device, e.g., for group III-V material semiconductor devices.

An important consideration for transistor scaling is controlling transistor off-state leakage (Ioff) which impacts stand-by power. To address this issue, in the past, the semiconductor industry has progressed towards thin-body (e.g., silicon-on-insulator, SOI) type structures, non-planar structures (e.g., finfets or tri-gates) and is contemplating nanowire devices. Embodiments described herein may employ band gap engineering to further improve transistor Ioff. Such improvements may become more critical when a semiconductor channel material is replaced with a high mobility material (such as group III-V materials) which traditionally have smaller band gaps. Smaller band gap materials may be more susceptible to Ioff issues. Nonetheless, band gap engineering may also be applicable to more conventional group IV semiconductors (e.g., Si, SiGe and Ge).

Figure 1A:
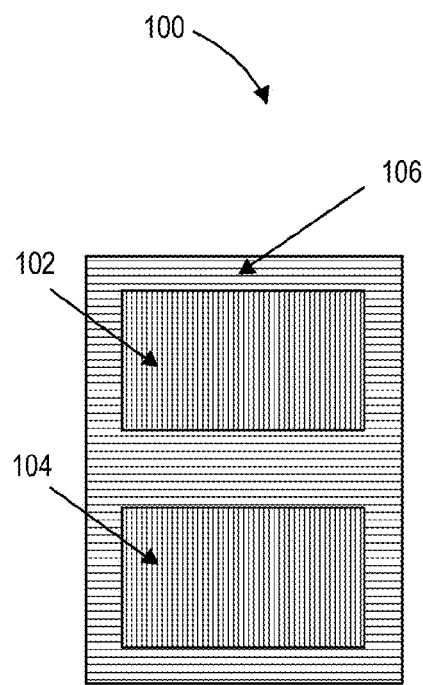
FIG. 1A illustrates a cross-sectional view taken along a channel region of a conventional multi-wire semiconductor device.

To aid in illustrating the above concepts, and to facilitate comparison with embodiments of the present invention, FIG. 1A illustrates a cross-sectional view taken along a channel region of a conventional multi-wire semiconductor device. Referring to FIG. 1A, a portion of a semiconductor device 100 includes two nanowire channel regions 102 and 104, e.g., group III-V material nanowires such as InGaAs nanowires. A gate stack 106 surrounds the two nanowire channel regions 102 and 104. The gate stack 106 includes a gate dielectric layer adjacent the two nanowire channel regions 102 and 104 and a gate electrode adjacent the gate dielectric layer (not individually shown), e.g., a high-k gate dielectric layer and a metal gate electrode.

Figure 1B:
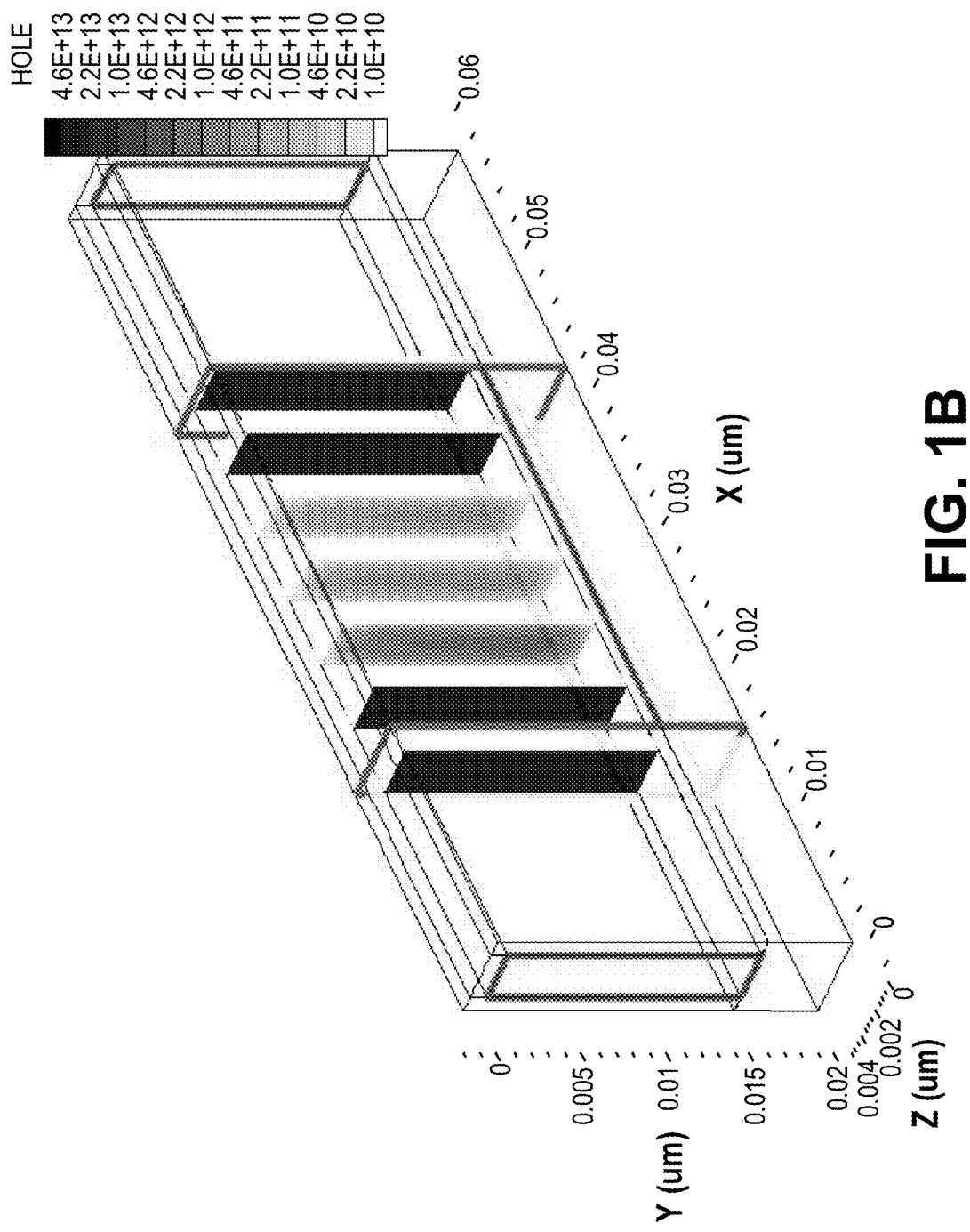
FIG. 1B is a plot showing a simulation of $I_{OFF}$ parameters for the semiconductor device of FIG. 1A.

FIG. 1B is a plot showing a simulation of $I_{OFF}$ parameters for the semiconductor device 100. Referring to the plot of FIG. 1B, the current in the off-state is nearly equally distributed through the volume of each nanowire, which is in contrast to the on-state when the current is confined to the perimeter of each nanowire.

In accordance with an embodiment, of the present invention, Ioff is reduced by reducing the available volume in one or more nanowires or three-dimensional bodies of a semiconductor device. In one such embodiment, although one such approach could include fabricating a hollow nanowire (e.g., a nano-pipe), instead band gap engineering is used to prevent current from flowing in the interior of the nanowire. Since the former hollowing approach may be difficult to implement, the latter approach may be preferred. In one such embodiment, an inner portion of a nanowire or other three-dimensional body has a higher band gap than an outer cladding layer at least partially surrounding the inner portion. In a specific embodiment, a low band gap cladding layer is used to confine current flow to a perimeter of the nanowire of three-dimensional body. It is to be understood that reference to a channel region in such embodiments includes both the inner higher band gap material and the outer lower band gap cladding layer.

Figure 2:
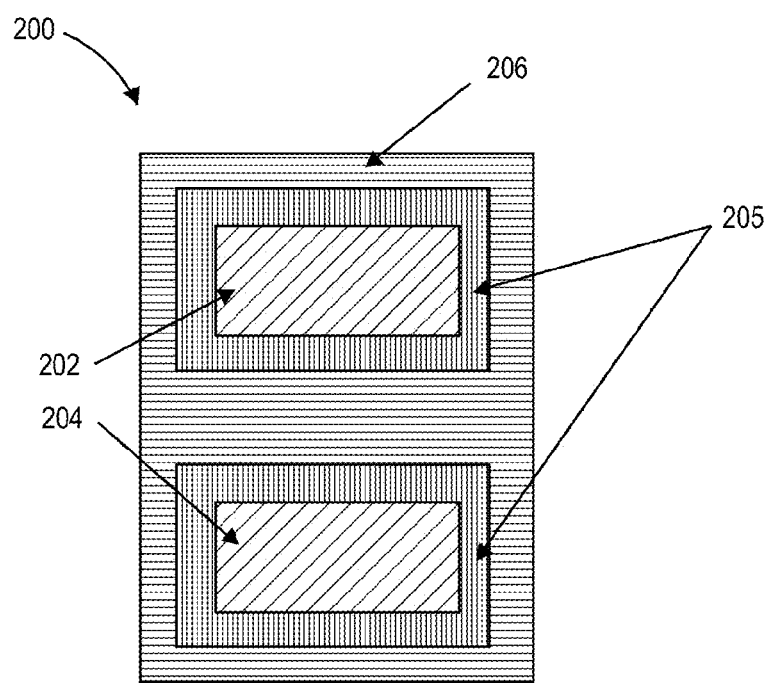
FIG. 2 illustrates a cross-sectional view taken along a channel region of a multi-wire semiconductor device, in accordance with an embodiment of the present invention.

As an example of the above cladding approach, FIG. 2 illustrates a cross-sectional view taken along a channel region of a multi-wire semiconductor device, in accordance with an embodiment of the present invention. Referring to FIG. 2, a portion of a semiconductor device 200 includes two inner nanowire channel region portions 202 and 204, e.g., group III-V material inner nanowire channel region portions. The two inner nanowire channel region portions 202 and 204 are surrounded by a cladding layer 205, e.g., a group III-V material cladding layer (e.g., InGaAs) having a lower band gap than the material of the two inner nanowire channel region portions 202 and 204. Thus, as compared with semiconductor device 100, semiconductor device 200 includes the original III-V channel material as limited to the exterior of the nanowire, e.g., as the cladding layer, while interior is composed of a different, higher band gap, material. A gate stack 206 surrounds the cladding layer 205. The gate stack 206 includes a gate dielectric layer adjacent the cladding layer 205 and a gate electrode adjacent the gate dielectric layer (not individually shown), e.g., a high-k gate dielectric layer and a metal gate electrode. It is to be understood that although two nanowires are depicted in FIG. 2, in alternate embodiments a single nanowire or greater than two nanowires may be used.

In an embodiment, since the material of the inner nanowire channel region portion 202 or 204 has larger band gap and band offsets than cladding layer 205, current flow is prevented in the inner region or interior of the channel region. That is, current flow is limited to the cladding layer 205. Such a cladding layer may be optimized for the mobility, effective mass and on-state performance of a nanowire (or other three-dimensional body) transistor with reduced off-state issues. On the other hand, the inner portion or layer may be optimized to reduce the current flow through that portion of the device, such as by increasing its band gap and band offsets relative to the cladding layer.

Figure 3:
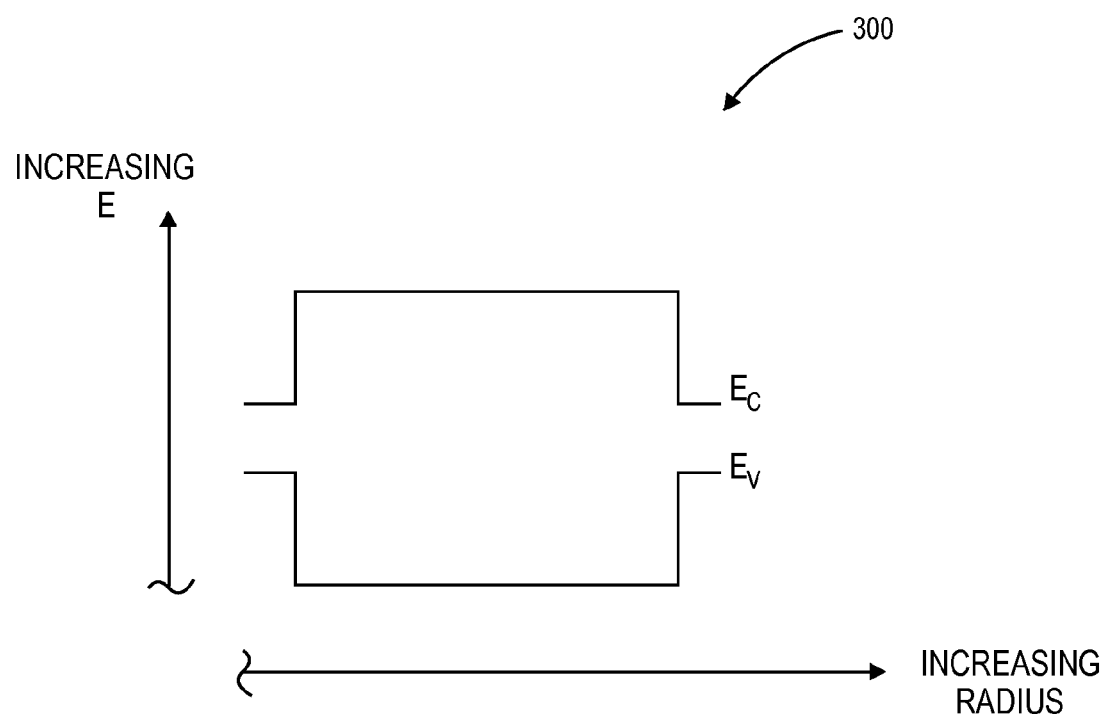
FIG. 3 is a plot 300 representing a band structure of a nanowire with a cladding layer, in the form of energy (E) as a function of radius), in accordance with an embodiment of the present invention.

FIG. 3 is a plot 300 representing a band structure of a nanowire with a cladding layer, in the form of energy (E) as a function of radius, in accordance with an embodiment of the present invention. Referring to plot 300, a smaller band gap in a cladding (outer) layer is optimized for transport (on-state) whereas an inner portion has a larger band gap to reduce current flow in the bulk of the nanowire.

Semiconductor device 200 (described above) or semiconductor devices 400 and 500 (described below) may be a semiconductor device incorporating a gate, a channel region and a pair of source/drain regions. In an embodiment, semiconductor device 200 (or 400 or 500) is one such as, but not limited to, a MOS-FET or a Microelectromechanical System (MEMS). In one embodiment, semiconductor device 200 (or 400 or 500) is a three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

As mentioned above, a cladding layer may be used for a nanowire device (see more detailed description in association with FIGS. 5A-5C below), but may also be used in other three-dimensional semiconductor devices (e.g., devices with protruding channel regions, such as in a tri-gate or FIN-FET based MOS-FETs). Furthermore, the cladding layer may completely surround an inner channel portion (e.g., FIGS. 5A-5C below), or may only partially surround an inner channel portion (e.g., one of the embodiments described below in association with FIG. 4).

In a first example, FIG. 4 illustrates an angled view of a non-planar semiconductor device having a channel region with a low band-gap cladding layer, in accordance with an embodiment of the present invention.

Referring to FIG. 4, a semiconductor device 400 includes a hetero-structure 404 disposed above a substrate 402. The hetero-structure 404 includes a bottom barrier layer 428. A three-dimensional group III-V material body 406, such as a group III-V material body, with a channel region 408 is disposed above the bottom barrier layer 428. The three-dimensional body 406 includes an inner region 406A and a cladding layer 406B. A gate stack 418 is disposed to surround at least a portion of the channel region 408. The gate stack 418 includes a gate electrode 424 and a gate dielectric layer 420. The gate stack may further include dielectric spacers 460.

In an embodiment, not viewable from the perspective of FIG. 4, the gate stack completely surrounds the channel region 408. In that embodiment, the cladding layer 406B may completely surround the inner region 406A, at least at the channel region 408. In another embodiment, however, the gate stack only partially surrounds the channel region 408. In that embodiment, the cladding layer 406B may also only partially surround the inner region 406A.

Source and drain regions 414/416 may be formed in or on portions of the three-dimensional body 406 not surrounded by gate stack 418. Furthermore, a top barrier layer may be included in those regions as well. Also, isolation regions 470 may be included. Although depicted in FIG. 4 as being somewhat aligned with the bottom of the bottom barrier layer 428, it is to be understood that the depth of the isolation regions 470 may vary. Also, although depicted in FIG. 4 as being somewhat aligned with the top of the bottom barrier layer 428, it is to be understood that the height of the isolation regions 470 may vary.

Substrate 402 may be composed of a material suitable for semiconductor device fabrication. In one embodiment, substrate 402 is a bulk substrate composed of a single crystal of a material which may include, but is not limited to, silicon, germanium, silicon-germanium or a III-V compound semiconductor material. In another embodiment, substrate 402 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 402 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 402 may further include dopant impurity atoms.

Hetero-structure 404 include a stack of one or more crystalline semiconductor layers, such as a compositional buffer layer (not shown) with the bottom barrier layer 428 disposed thereon. The compositional buffer layer may be composed of a crystalline material suitable to provide a specific lattice structure onto which a bottom barrier layer may be formed with negligible dislocations. For example, in accordance with an embodiment of the present invention, the compositional buffer layer is used to change, by a gradient of lattice constants, the exposed growth surface of semiconductor hetero-structure 404 from the lattice structure of substrate 402 to one that is more compatible for epitaxial growth of high quality, low defect layers thereon. In one embodiment, the compositional buffer layer acts to provide a more suitable lattice constant for epitaxial growth instead of an incompatible lattice constant of substrate 402. In an embodiment, substrate 402 is composed of single-crystal silicon and the compositional buffer layer grades to a bottom barrier layer composed of a layer of InAlAs having a thickness of approximately 1 micron. In an alternative embodiment, the compositional buffer layer is omitted because the lattice constant of substrate 402 is suitable for the growth of a bottom barrier layer 428 for a semiconductor device.

The bottom barrier layer 428 may be composed of a material suitable to confine a wave-function in a channel region formed thereon. In accordance with an embodiment of the present invention, the bottom barrier layer 428 has a lattice constant suitably matched to the top lattice constant of the compositional buffer layer, e.g., the lattice constants are similar enough that dislocation formation in the bottom barrier layer 428 is negligible. In one embodiment, the bottom barrier layer 428 is composed of a layer of approximately $In_{0.65}Al_{0.35}As$ having a thickness of approximately 10 nanometers. In a specific embodiment, the bottom barrier layer 428 is composed of the layer of approximately $In_{0.65}Al_{0.35}As$ is used for quantum confinement in an N-type semiconductor device. In another embodiment, the bottom barrier layer 428 is composed of a layer of approximately $In_{0.65}Al_{0.35}Sb$ having a thickness of approximately 10 nanometers. In a specific embodiment, the bottom barrier layer 428 composed of the layer of approximately $In_{0.65}Al_{0.35}Sb$ is used for quantum confinement in a P-type semiconductor device.

In an embodiment, the three-dimensional body 406 includes the inner region 406A having a higher band gap than the cladding layer 406B. The choice of cladding layer 406B/inner region 406A combinations is in principle plentiful. For example, pairs that are lattice matched (or nearly lattice matched) in the group material regime, including InGaAs/InP, GaAs/AlGaAs, InSb/AlInSb, may be used. Although many embodiments described herein are directed to group material channel regions, other embodiments may include the use of Si/SiGe/Ge. For example, a low band gap Ge-rich cladding layer may be used together with a high band gap Si-rich inner region. In general, cladding layer 406B may be composed of a material suitable to propagate a wave-function with low resistance. In an embodiment, cladding layer 406B is composed of groups III (e.g. boron, aluminum, gallium or indium) and V (e.g. nitrogen, phosphorous, arsenic or antimony) elements. In one embodiment, cladding layer 406B is composed of InAs or InSb. The cladding layer 406B may have a thickness suitable to propagate a substantial portion of a wave-function, e.g. suitable to inhibit a significant portion of the wave-function from entering the inner region 406A. In an embodiment, cladding layer 406B has a thickness approximately in the range of 50-100 Angstroms. In the case of a group III-V material hetero-structure, the inner region 406B may be composed of the same material as a bottom barrier layer in the hetero-structure.

If a top barrier layer is used (not shown), the top barrier layer may be composed of a material suitable to confine a wave-function in a III-V material (or other low band gap material) body/channel region formed there under. In accordance with an embodiment of the present invention, a top barrier layer has a lattice constant suitably matched to the lattice constant of cladding layer 406B, e.g., the lattice constants are similar enough that dislocation formation in a top barrier layer is negligible. In one embodiment, a top barrier layer is composed of a layer of material such as, but not limited to, N-type InGaAs. Source and drain material regions, e.g., formed at locations 414 and 416, may be doped group III-V material region, such a more heavily doped structure formed from the same or similar material as a top barrier layer. In other embodiments, the source and drain regions are formed in body 406 at locations 414 and 416.

In an embodiment, referring again to FIG. 4, the gate electrode 424 of gate electrode stack 418 is composed of a metal gate and the gate dielectric layer 420 is composed of a high-K material. For example, in one embodiment, the gate dielectric layer 420 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 420 may include a layer of native oxide formed from the top few layers of the semiconductor body 406. In an embodiment, the gate dielectric layer 420 is composed of a top high-k portion and a lower portion composed of an oxide of a semiconductor material. In one embodiment, the gate dielectric layer 420 is composed of a top portion of hafnium oxide and a bottom portion of silicon dioxide or silicon oxy-nitride.

In one embodiment, the gate electrode 424 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode 524 is composed of a non-workfunction-setting fill material formed above a metal workfunction-setting layer.

In a second example, FIG. 5A illustrates a three-dimensional cross-sectional view of a nanowire-based semiconductor structure having one or more channel regions with a low band-gap cladding layer, in accordance with an embodiment of the present invention. FIG. 5B illustrates a cross-sectional channel view of the nanowire-based semiconductor structure of FIG. 5A, as taken along the a-a' axis. FIG. 5C illustrates a cross-sectional spacer view of the nanowire-based semiconductor structure of FIG. 5A, as taken along the b-b' axis.

Referring to FIG. 5A, a semiconductor device 500 includes one or more vertically stacked nanowires (504 set) disposed above a substrate 502. Embodiments herein are targeted at both single wire devices and multiple wire devices. As an example, a three nanowire-based devices having nanowires 504A, 504B and 504C is shown for illustrative purposes. For convenience of description, nanowire 504A is used as an example where description is focused on only one of the nanowires. It is to be understood that where attributes of one nanowire are described, embodiments based on a plurality of nanowires may have the same attributes for each of the nanowires.

Each of the nanowires 504 includes a channel region 506 disposed in the nanowire. The channel region 506 has a length (L). Referring to FIG. 5B, the channel region also has a perimeter orthogonal to the length (L). Referring to both FIGS. 5A and 5B, a gate electrode stack 508 surrounds the entire perimeter of each of the channel regions 506. The gate electrode stack 508 includes a gate electrode along with a gate dielectric layer disposed between the channel region 506 and the gate electrode (not shown). The channel region 506 is discrete in that it is completely surrounded by the gate electrode stack 508 without any intervening material such as underlying substrate material or overlying channel fabrication materials. Accordingly, in embodiments having a plurality of nanowires 504, the channel regions 506 of the nanowires are also discrete relative to one another, as depicted in FIG. 5B.

In an embodiment, the channel region 506 includes the inner region 506A having a higher band gap than the cladding layer 506B. The choice of cladding layer 506B/inner region 506A combinations is in principle plentiful. For example, pairs that are lattice matched (or nearly lattice matched) in the group III-V material regime, including InGaAs/InP, GaAs/AlGaAs, InSb/AlInSb, may be used. Although many embodiments described herein are directed to group III-V material channel regions, other embodiments may include the use of Si/SiGe/Ge. For example, a low band gap Ge-rich cladding layer may be used together with a high band gap Si-rich inner region. In general, cladding layer 506B may be composed of a material suitable to propagate a wave-function with low resistance. In an embodiment, cladding layer 506B is composed of groups III (e.g. boron, aluminum, gallium or indium) and V (e.g. nitrogen, phosphorous, arsenic or antimony) elements. In one embodiment, cladding layer 506B is composed of InAs or InSb. The cladding layer 506B may have a thickness suitable to propagate a substantial portion of a wave-function, e.g. suitable to inhibit a significant portion of the wave-function from entering the inner region 506A. In an embodiment, cladding layer 506B has a thickness approximately in the range of 50-100 Angstroms. In the case of a group III-V material hetero-structure, the inner region 506B may be composed of the same material as a bottom barrier layer in the hetero-structure.

In an embodiment, the nanowires 504 may be sized as wires or ribbons (the latter described below), and may have squared-off or rounded corners. In an embodiment, the nanowires 504 are uniaxially strained nanowires. The uniaxially strained nanowire or plurality of nanowires may be uniaxially strained with tensile strain or with compressive strain, e.g., for NMOS or PMOS, respectively.

The width and height of each of the channel regions 506 is shown as approximately the same in FIG. 5B, however, they need not be. For example, in another embodiment (not shown), the width of the nanowires 504 is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 504 has a width and a height, the width substantially less than the height. In an embodiment, the nanowires 504 may be sized as wires or ribbons, and may have squared-off or rounded corners.

Referring again to FIG. 5A, each of the nanowires 504 also includes source and drain regions 510 and 512 disposed in the nanowire on either side of the channel region 504. A pair of contacts 514 is disposed over the source/drain regions 510/512. In a specific embodiment, the pair of contacts 514 surrounds the entire perimeter of each of the source/drain regions 510/512, as depicted in FIG. 5A. That is, in an embodiment, the source/drain regions 510/512 are discrete in that they are completely surrounded by the contacts 514 without any intervening material such as underlying substrate material or overlying channel fabrication materials. Accordingly, in such an embodiment having a plurality of nanowires 504, the source/drain regions 510/512 of the nanowires are also discrete relative to one another.

Referring again to FIG. 5A, in an embodiment, the semiconductor device 500 further includes a pair of spacers 516. The spacers 516 are disposed between the gate electrode stack 508 and the pair of contacts 514. As described above, the channel regions and the source/drain regions are, in at least several embodiments, made to be discrete. However, not all regions of the nanowires 504 need be, or even can be made to be discrete. For example, referring to FIG. 5C, nanowires 504A-504C are not discrete at the location under spacers 516. In one embodiment, the stack of nanowires 504A-504C have intervening semiconductor material 580 there between, such as germanium intervening between group III-V material nanowires, or vice versa, as described below in association with FIGS. 6A-6F. In one embodiment, the bottom nanowire 504A is still in contact with a portion of substrate 502, e.g., in contact with an insulating layer portion disposed on a bulk substrate. Thus, in an embodiment, a portion of the plurality of vertically stacked nanowires under one or both of the spacers is non-discrete.

Although the device 500 described above is for a single device, e.g., an NMOS or a PMOS device, a CMOS architecture may also be formed to include both NMOS and PMOS nanowire-based devices disposed on or above the same substrate, e.g., as described in association with FIGS. 6A-6F, below.

Referring again to FIGS. 5A-5C, the substrate 502 may be composed of a material suitable for semiconductor device fabrication. In one embodiment, substrate 502 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is disposed on the lower bulk substrate. Thus, the structure 500 may be fabricated from a starting semiconductor-on-insulator substrate. As such, in one embodiment, the plurality of vertically stacked nanowires 504 is disposed above a bulk crystalline substrate having an intervening dielectric layer disposed thereon, as depicted in FIGS. 5A-5C. Alternatively, the structure 500 is formed directly from a bulk substrate and local oxidation is used to form electrically insulative portions in place of the above described upper insulator layer. As such, in another embodiment, the plurality of vertically stacked nanowires 504 is disposed above a bulk crystalline substrate having no intervening dielectric layer disposed thereon. In another embodiment, a top barrier layer having a high band gap, such as a group III-V material barrier layer is used to isolate the bottom nanowire 504A from and underlying substrate.

In an embodiment, referring again to FIG. 5A, the gate electrode of gate electrode stack 508 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 504. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the spacers 516 are composed of an insulative dielectric material such as, but not limited to, silicon dioxide, silicon oxy-nitride or silicon nitride. The contacts 514 are, in an embodiment, fabricated from a metal species. The metal species may be a pure metal, such as nickel or cobalt, or may be an alloy such as a metal-metal alloy or a metal-semiconductor alloy (e.g., such as a silicide material).

Referring again to FIG. 5A, each of the nanowires 550 also includes source and drain regions 510/512 disposed in or on the nanowire on either side of the channel regions 506. In an embodiment, the source and drain regions 510/512 are embedded source and drain regions, e.g., at least a portion of the nanowires is removed and replaced with a source/drain material region. However, in another embodiment, the source and drain regions 510/512 are composed of, or at least include, portions of the one or more nanowires 504.

It is to be understood that although the device 500 described above is for a single device, a CMOS architecture may also be formed to include both NMOS and PMOS nanowire-based devices disposed on or above the same substrate.

Thus, in another aspect, methods of fabricating nanowires with cladding layers are provided. FIGS. 6A-6F illustrate three-dimensional cross-sectional views representing various operations in a method of fabricating a CMOS nanowire semiconductor structure, in accordance with an embodiment of the present invention.

Figure 6A:
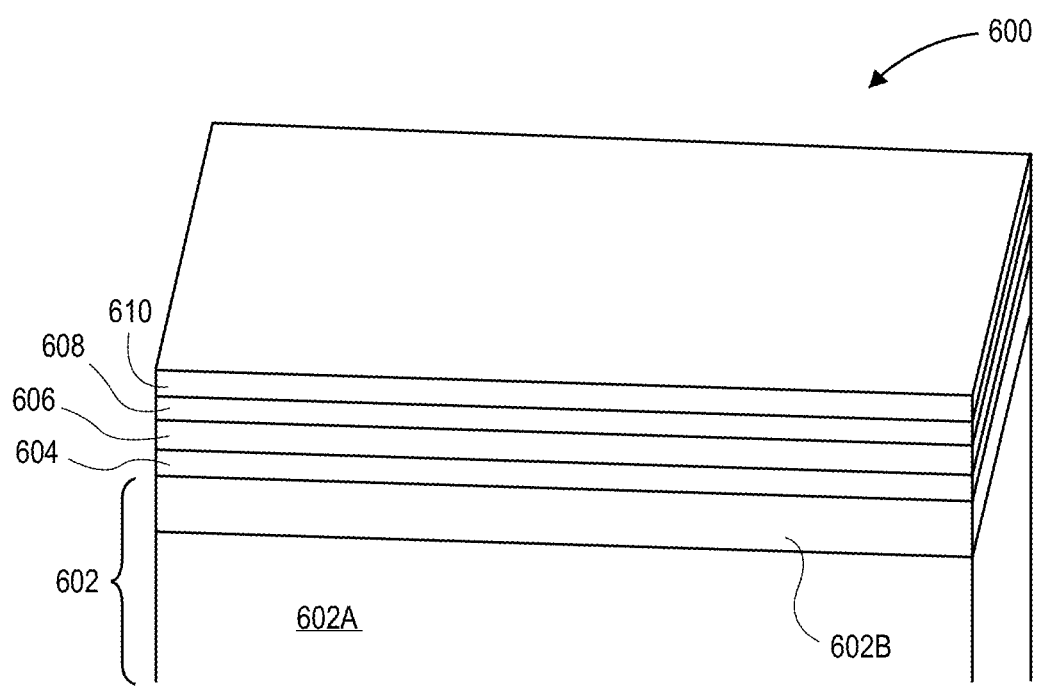
FIGS. 6A-6F illustrate three-dimensional cross-sectional views representing various operations in a method of fabricating a CMOS nanowire semiconductor structure, in accordance with an embodiment of the present invention.

A method of fabricating a nanowire semiconductor structure may, in an embodiment, include forming both a PMOS nanowire-based semiconductor device and an adjacent NMOS nanowire-based semiconductor device. Each device may be fabricated by forming a nanowire above a substrate. In a specific embodiment ultimately providing the formation of two nanowires for each of the NMOS and PMOS nanowire-based semiconductor devices, FIG. 6A illustrates an initial structure 600 having a substrate 602 (e.g., composed of a bulk substrate 602A with an insulating or barrier layer 602B there on). A III-V material layer 604/germanium layer 606/III-V material layer 608/germanium layer 610 stack is disposed on the stack 602. Of course, the ordering of such layers may be reversed.

Figure 6B:
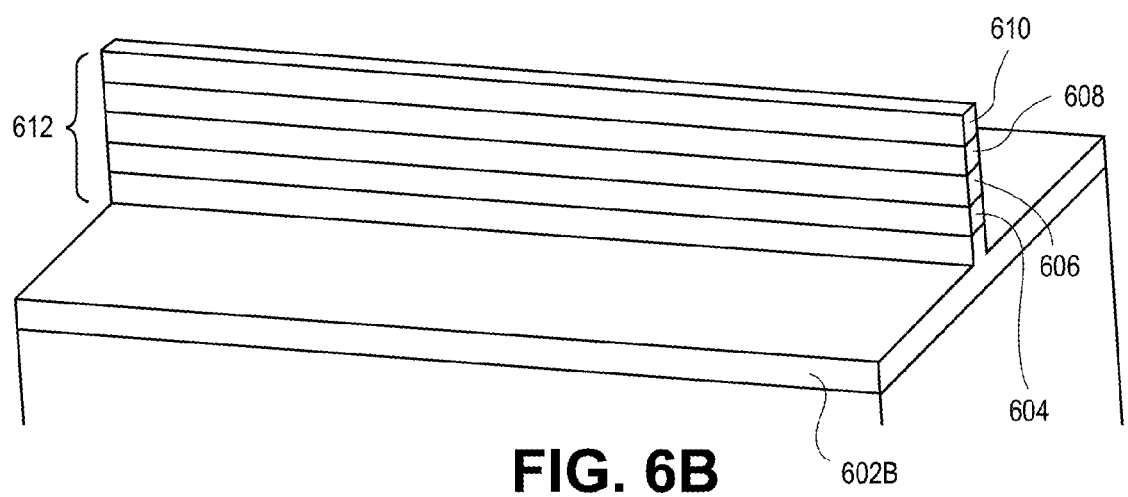

Referring to FIG. 6B, a portion of the III-V material layer 604/germanium layer 606/III-V material layer 608/germanium layer 610 stack as well as a top portion of the insulator or barrier layer 602B is patterned into a fin-type structure 612, e.g., with a mask and plasma etch process. Thus, in an embodiment, a free surface is formed on either side of each of the III-V material and germanium layers by patterning to provide the fin-type structure 612.

Figure 6C:
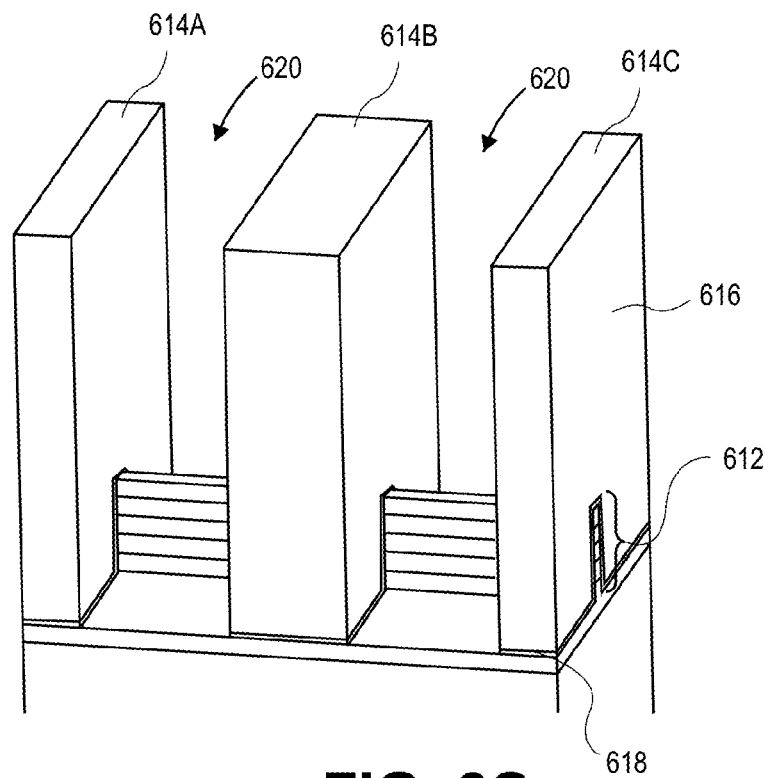

In a specific example showing the formation of three gate structures, FIG. 6C illustrates the fin-type structure 612 with three sacrificial gates 614A, 614B, and 614C disposed thereon. In one such embodiment, the three sacrificial gates 614A, 614B, and 614C are composed of a sacrificial gate oxide layer 616 and a sacrificial polysilicon gate layer 618 which are, e.g., blanket deposited and patterned with a plasma etch process.

Figure 6D:
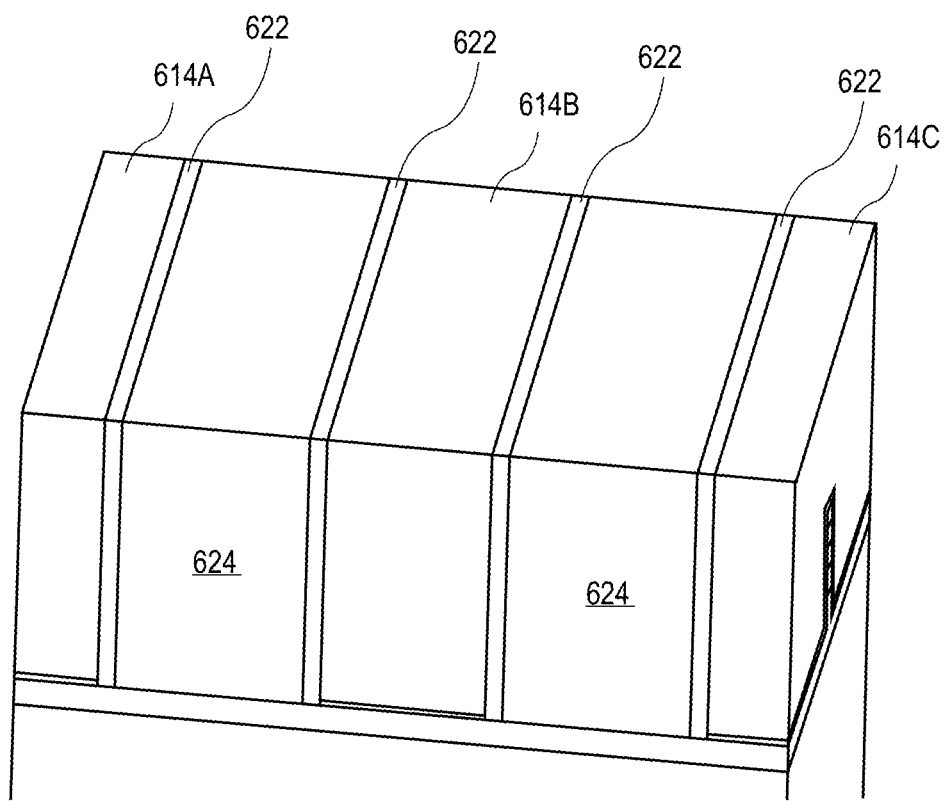

Following patterning to form the three sacrificial gates 614A, 614B, and 614C, spacers may be formed on the sidewalls of the three sacrificial gates 614A, 614B, and 614C, doping may be performed in regions 620 of the fin-type structure 612 shown in FIG. 6C (e.g., tip and/or source and drain type doping), and an interlayer dielectric layer may be formed to cover and then re-expose the three sacrificial gates 614A, 614B, and 614C. The interlayer dielectric layer may then be polished to expose the three sacrificial gates 614A, 614B, and 614C for a replacement gate, or gate-last, process. Referring to FIG. 6D, the three sacrificial gates 614A, 614B, and 614C are exposed, along with spacers 622 and interlayer dielectric layer 624.

The sacrificial gates 614A, 614B, and 614C may then be removed, e.g., in a replacement gate or gate-last process flow, to expose channel portions of the fin-type structure 612. Referring to the left-hand portion of FIG. 6E, in the case that the fin-type structure 612 is used to fabricate an NMOS device, the sacrificial gates 614A, 614B, and 614C are removed to provide trenches 626. Portions of the germanium layers 606 and 610 exposed by the trenches 626, as well as exposed portions of the insulating or barrier layer 602B, are removed to leave discrete portions of the group III-V material layers 604 and 608. Referring to the right-hand portion of FIG. 6E, in the case that the fin-type structure 612 is used to fabricate a PMOS device, the sacrificial gates 614A, 614B, and 614C are removed to provide trenches 628. Portions of the III-V material layers 604 and 608 exposed by the trenches 628 are removed to leave discrete portions of the germanium layers 606 and 610.

Figure 6E:
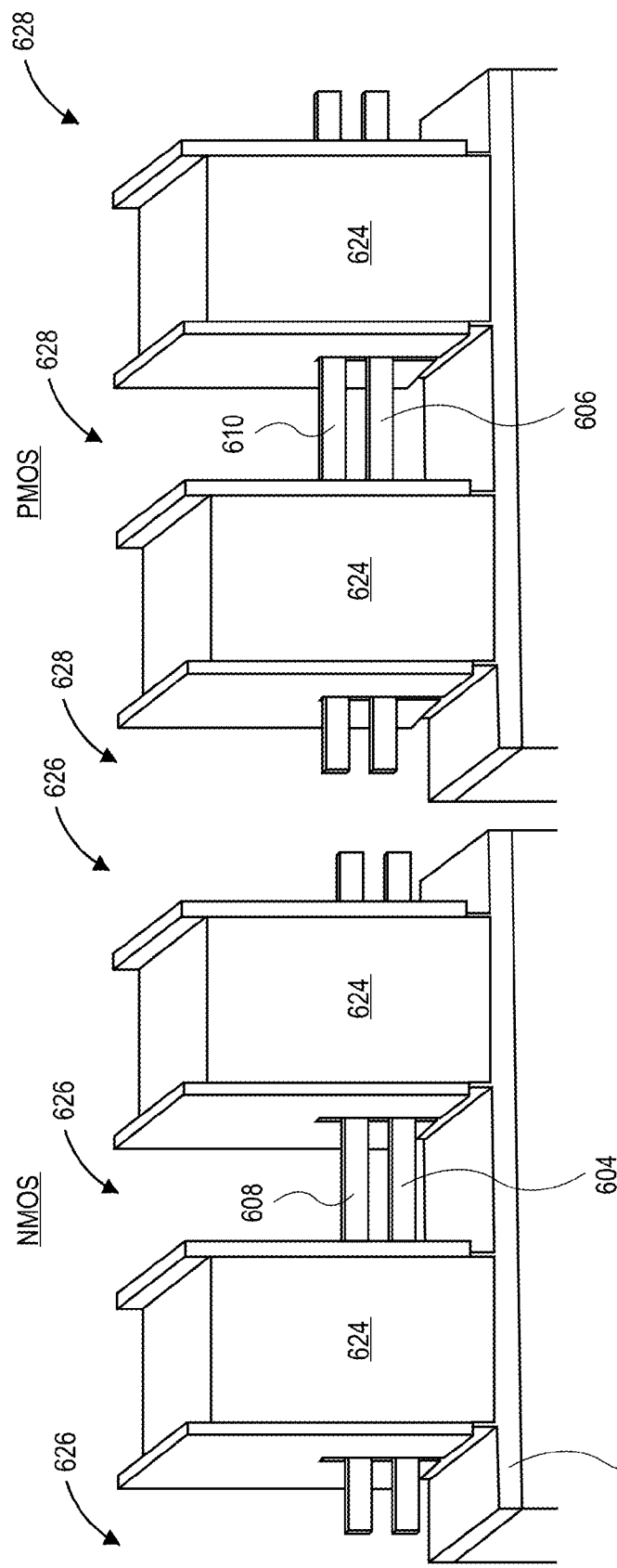

In an embodiment, referring to the right-hand portion of FIG. 6E, the group III-V material layers 604 and 608 are etched selectively with a wet etch that selectively removes the group III-V material while not etching the germanium nanowire structures 606 and 610. In another embodiment, referring to the left-hand portion of FIG. 6E, the germanium layers 606 and 610 are etched selectively with a wet etch that selectively removes the germanium while not etching the group III-V material nanowire structures 604 and 608. Thus, either the group III-V material layers may be removed from the fin-type structure 612 to form germanium channel nanowires, or the germanium layers may be removed from the fin-type structure 612 to form group III-V material channel nanowires.

The discrete portions of the group III-V material layers 604 and 608 (NMOS) or the germanium layers 606 and 610 (PMOS) shown in FIG. 6E will, in one embodiment, ultimately become channel regions in a nanowire-based structure. Thus, at the process stage depicted in FIG. 6E, channel engineering or tuning may be performed. For example, in one embodiment, the discrete portions of the group III-V material layers 604 and 608 shown in the left-hand portion of FIG. 6E, or the discrete portions of the germanium layers 606 and 610 shown in the right-hand portion of FIG. 6E, are thinned using oxidation and etch processes. Such an etch process may be performed at the same time the wires are separated by etching the opposing group III-V material or germanium layers. Accordingly, the initial wires formed from group III-V material layers 604 and 608, or from germanium layers 606 and 610, begin thicker and are thinned in subsequent processing. In addition to, or as an alternative to, the thinning, a low band gap cladding layer may be formed to surround one or more of the exposed channel regions. The cladding layers may be those as described above, e.g., cladding layers 205, 406B or 506B.

Figure 6F:
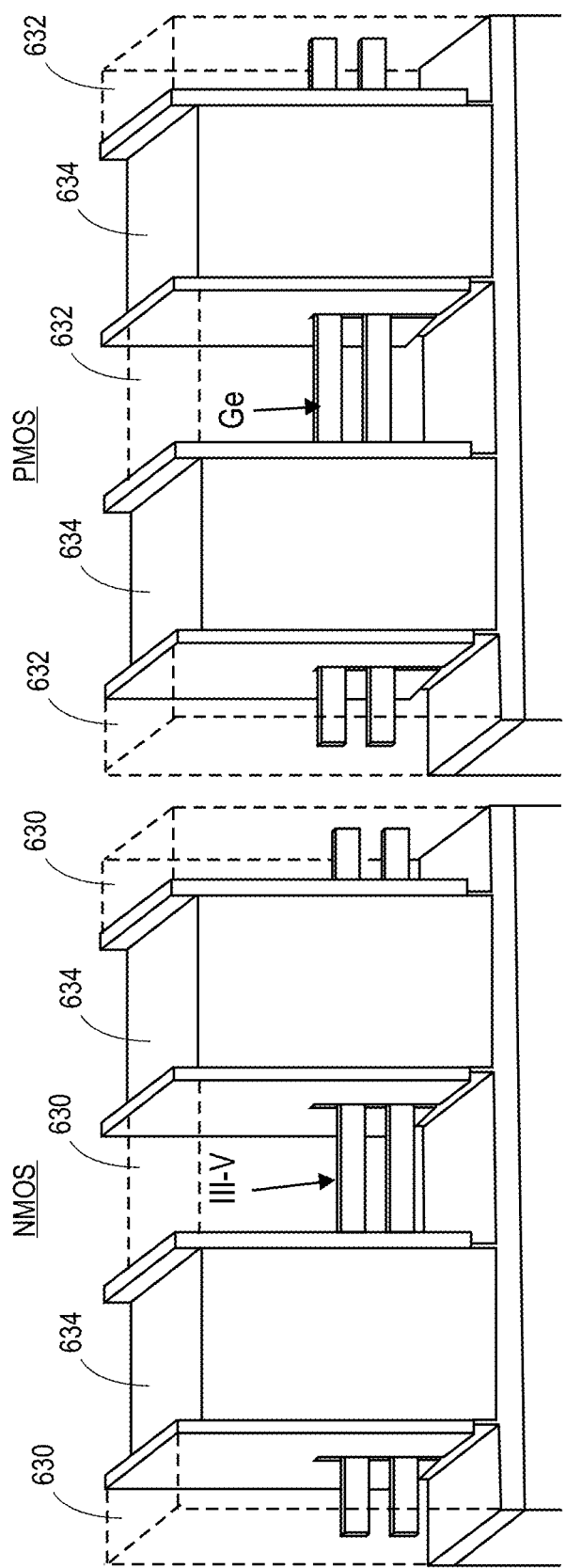

Following formation of the discrete channel regions as depicted in FIG. 6E, high-k gate dielectric and metal gate processing may be performed and source and drain contacts may be added. In the specific example showing the formation of three gate structures over two group III-V material nanowires (NMOS) or over two germanium nanowires (PMOS), FIG. 6F illustrates the structure following deposition of an NMOS gate stack 630 or a PMOS gate stack 632. The gate stacks may be composed of a high-k gate dielectric layer and an N-type or P-type metal gate electrode layer, respectively. Additionally, FIG. 6F depicts the result of the subsequent removal of the interlayer dielectric layer 624 after formation of the permanent gate stack. Contacts may be formed in the place of the interlayer dielectric layer 624 portions remaining in FIG. 6E. In an embodiment, at some stage during the process of removing 624 and forming contacts 634, source and drain engineering may also be performed.

Thus, one or more embodiments described herein are targeted at active region arrangements having low band gap outer cladding layers. Although described above with respect to benefits for non-planar and gate-all-around devices, benefits may also be achieved for planar devices without gate wrap-around features. Thus, such arrangements may be included to form high mobility material-based transistors such as planar devices, fin or tri-gate based devices, and gate all around devices, including nanowire-based devices. It is to be understood that formation of materials such as the III-V material layers (or other high mobility, low band gap materials) described herein may be performed by techniques such as, but not limited to, chemical vapor deposition (CVD) or molecular beam epitaxy (MBE), or other like processes.

Figure 7:
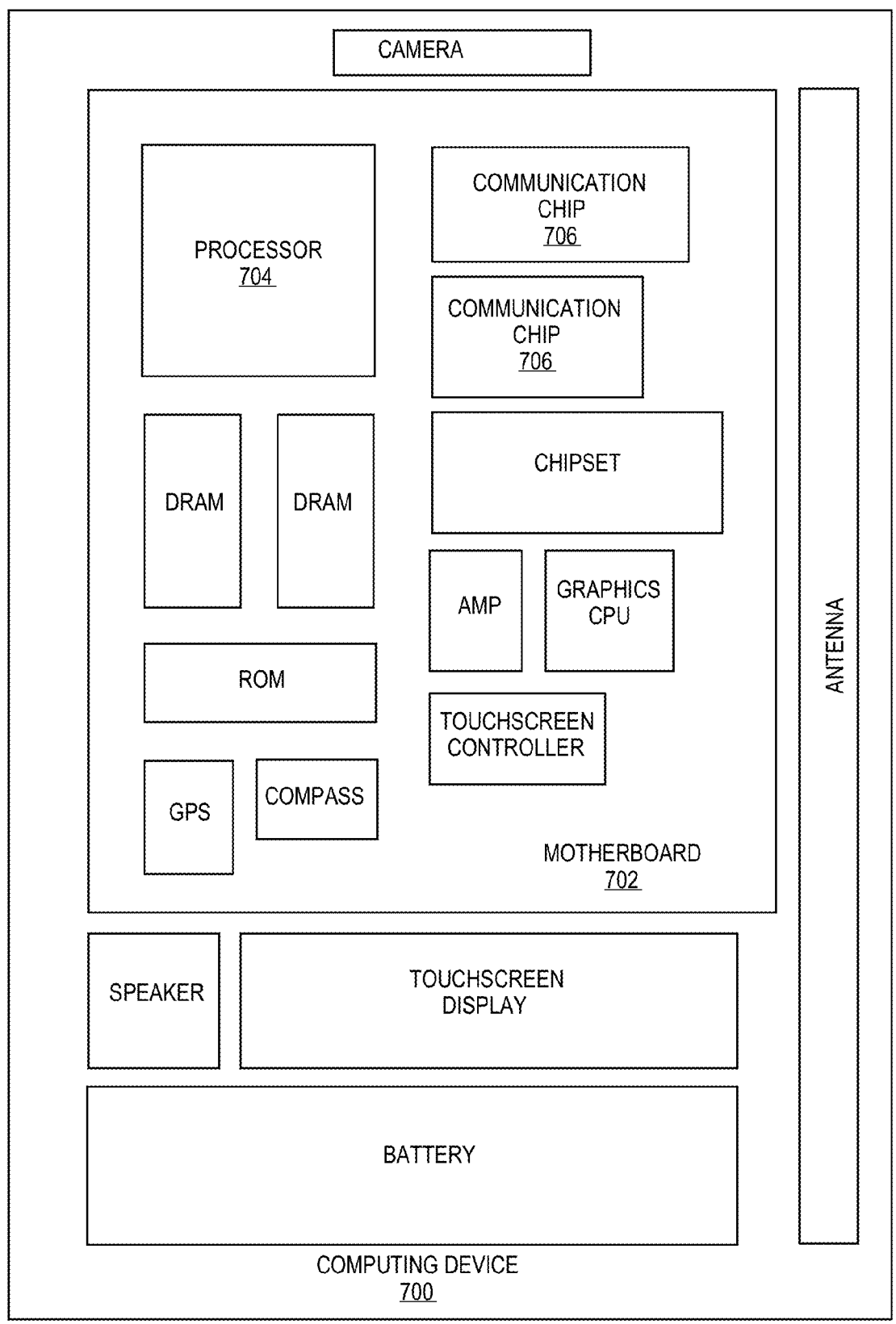
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include non-planar semiconductor devices having channel regions with low band-gap cladding layers.

In an embodiment, a semiconductor device includes a vertical arrangement of a plurality of nanowires disposed above a substrate. Each nanowire includes an inner region having a first band gap and an outer cladding layer surrounding the inner region. The cladding layer has a second, lower band gap. A gate stack is disposed on and completely surrounds the channel region of each of the nanowires. The gate stack includes a gate dielectric layer disposed on and surrounding the cladding layer and a gate electrode disposed on the gate dielectric layer. Source and drain regions are disposed on either side of the channel regions of the nanowires.

In one embodiment, the cladding layer is composed of a material suitable to propagate a wave-function with low resistance.

In one embodiment, the inner region of each channel region is composed of a material suitable to substantially prevent current flow from source regions to drain regions.

In one embodiment, material pairs of the cladding layer and inner region are pairs such as, but not limited to, InGaAs/InP, GaAs/AlGaAs or InSb/AlInSb.

In one embodiment, the cladding layer is germanium-rich and the inner region is silicon-rich.

In one embodiment, the cladding layer has a thickness suitable to propagate a substantial portion of a wave-function and to inhibit a significant portion of the wave-function from entering the inner region of each channel region.

In one embodiment, the cladding layer has a thickness approximately in the range of 50-100 Angstroms.

In one embodiment, the source and drain regions are formed within portions of each of the nanowires.

In one embodiment, the source and drain regions of each nanowire are discrete relative to one another, and the semiconductor device further includes a conductive source contact surrounding each of the discrete source regions and a conductive drain contact surrounding each of the discrete drain regions.

In one embodiment, the gate dielectric layer is a high-k gate dielectric layer, and the gate electrode is a metal gate electrode.

In an embodiment, a semiconductor device includes a hetero-structure disposed above a substrate and including a three-dimensional semiconductor body with a channel region. The channel region includes an inner region having a first band gap and an outer cladding layer at least partially surrounding the inner region. The cladding layer has a second, lower band gap. A gate stack is disposed on and at least partially surrounds the channel region. The gate stack includes a gate dielectric layer disposed on the cladding layer and a gate electrode disposed on the gate dielectric layer. Source and drain regions are disposed in the three-dimensional semiconductor body, on either side of channel region.

In one embodiment, the cladding layer completely surrounds the inner region of the channel region, and the gate stack completely surrounds the channel region.

In one embodiment, the cladding layer only partially surrounds the inner region of the channel region, and the gate stack only partially surrounds the channel region.

In one embodiment, the cladding layer is composed of a material suitable to propagate a wave-function with low resistance.

In one embodiment, the inner region of the channel region is composed of a material suitable to substantially prevent current flow from source region to drain region.

In one embodiment, material pairs of the cladding layer and inner region are pair such as, but not limited to, InGaAs/InP, GaAs/AlGaAs or InSb/AlInSb.

In one embodiment, the cladding layer is germanium-rich and the inner region is silicon-rich.

In one embodiment, the cladding layer has a thickness suitable to propagate a substantial portion of a wave-function and to inhibit a significant portion of the wave-function from entering the inner region of the channel region.

In one embodiment, the cladding layer has a thickness approximately in the range of 50-100 Angstroms.

In one embodiment, the gate dielectric layer is a high-k gate dielectric layer, and the gate electrode is a metal gate electrode.

In an embodiment, a semiconductor structure includes a first semiconductor device. The first semiconductor device includes a first vertical arrangement of a plurality of nanowires disposed above a substrate. Each nanowire includes an inner region having a first band gap and an outer cladding layer surrounding the inner region. The cladding layer has a second, lower band gap. A first gate stack is disposed on and completely surrounds the channel region of each of the nanowires. The first gate stack includes a gate dielectric layer disposed on and surrounding the cladding layer and a gate electrode disposed on the gate dielectric layer. Source and drain regions are disposed on either side of the channel regions of the nanowires of the first vertical arrangement of the plurality of nanowires. The semiconductor structure also includes a second semiconductor device. The second semiconductor device also includes a second vertical arrangement of a plurality of nanowires disposed above the substrate. A second gate stack is disposed on and completely surrounds the channel region of each of the nanowires. The second gate stack includes a gate dielectric layer and a gate electrode disposed on the gate dielectric layer. Source and drain regions are disposed on either side of the channel regions of the nanowires of the second vertical arrangement of the plurality of nanowires.

In one embodiment, the first semiconductor device is an NMOS device, and the second semiconductor device is a PMOS device.

In one embodiment, the cladding layer and inner region form a group III-V material hetero-junction.

In one embodiment, each nanowire of the second semiconductor device includes a second inner region having a first band gap and a second outer cladding layer surrounding the second inner region, the second cladding layer having a second, lower band gap.

In one embodiment, the cladding layer and the second cladding layer each is composed of a material suitable to propagate a wave-function with low resistance.

In one embodiment, the inner region and the second inner region each is composed of a material suitable to substantially prevent current flow from respective source regions to drain regions.

In one embodiment, material pairs of the cladding layer and inner region are pairs such as, but not limited to, InGaAs/InP, GaAs/AlGaAs or InSb/AlInSb, and the second cladding layer is germanium-rich and the second inner region is silicon-rich.

In one embodiment, each of the cladding layer and the second cladding layer has a thickness suitable to propagate a substantial portion of a wave-function and to inhibit a significant portion of the wave-function from entering the inner region and second inner region, respectively.

In one embodiment, each of the cladding layer and the second cladding layer has a thickness approximately in the range of 50-100 Angstroms.

In one embodiment, the gate dielectric layer of the first gate stack is a high-k gate dielectric layer, and the gate electrode of the first gate stack is an N-type metal gate electrode.

In one embodiment, the gate dielectric layer of the second gate stack is a high-k gate dielectric layer, and the gate electrode of the second gate stack is a P-type metal gate electrode.

What is claimed is:

1. A semiconductor device, comprising:
a vertical arrangement of a plurality of nanowires disposed above a substrate, each nanowire horizontally oriented with respect to the substrate and each nanowire comprising an inner region having a first band gap and an outer cladding layer surrounding the inner region, the cladding layer having a second, narrower band gap;
a gate stack disposed on and completely surrounding a channel region of each of the nanowires, the gate stack comprising a gate dielectric layer disposed on and surrounding the cladding layer and a gate electrode disposed on the gate dielectric layer; and
source and drain regions disposed on either side of the channel regions of the nanowires.

2. The semiconductor device of claim 1, wherein the cladding layer comprises a material suitable to propagate a wave-function with low resistance.

3. The semiconductor device of claim 2, wherein the inner region of each channel region comprises a material suitable to substantially prevent current flow from source regions to drain regions.

4. The semiconductor device of claim 1, wherein material pairs of the cladding layer and inner region are selected from the group consisting of InP/InGaAs, GaAs/AlGaAs and AlInSb/InSb.

5. The semiconductor device of claim 1, wherein the cladding layer is germanium-rich and the inner region is silicon-rich.

6. The semiconductor device of claim 1, wherein the cladding layer has a thickness suitable to propagate a substantial portion of a wave-function and to inhibit a significant portion of the wave-function from entering the inner region of each channel region.

7. The semiconductor device of claim 6, wherein the cladding layer has a thickness approximately in the range of 50-100 Angstroms.

8. The semiconductor device of claim 1, wherein the source and drain regions are formed within portions of each of the nanowires.

9. The semiconductor device of claim 1, wherein the source and drain regions of each nanowire are discrete relative to one another, the semiconductor device further comprising:
a conductive source contact surrounding each of the discrete source regions; and
a conductive drain contact surrounding each of the discrete drain regions.

10. The semiconductor device of claim 1, wherein the gate dielectric layer is a high-k gate dielectric layer, and the gate electrode is a metal gate electrode.

11. A semiconductor device, comprising:
a hetero-structure disposed above a substrate and comprising a three-dimensional semiconductor body with a channel region comprising an inner region having a first band gap and an outer cladding layer at least partially surrounding the inner region, the cladding layer having a second, narrower band gap;
a gate stack disposed on and at least partially surrounding the channel region, the gate stack comprising a gate dielectric layer disposed on the cladding layer and a gate electrode disposed on the gate dielectric layer, wherein the cladding layer only partially surrounds the inner region of the channel region, and the gate stack only partially surrounds the channel region; and
source and drain regions disposed in the three-dimensional semiconductor body, on either side of channel region.

12. The semiconductor device of claim 11, wherein the cladding layer comprises a material suitable to propagate a wave-function with low resistance.

13. The semiconductor device of claim 12, wherein the inner region of the channel region comprises a material suitable to substantially prevent current flow from source region to drain region.

14. The semiconductor device of claim 11, wherein material pairs of the cladding layer and inner region are selected from the group consisting of InP/InGaAs, GaAs/AlGaAs and AlInSb/InSb.

15. The semiconductor device of claim 11, wherein the cladding layer is germanium-rich and the inner region is silicon-rich.

16. The semiconductor device of claim 11, wherein the cladding layer has a thickness suitable to propagate a substantial portion of a wave-function and to inhibit a significant portion of the wave-function from entering the inner region of the channel region.

17. The semiconductor device of claim 16, wherein the cladding layer has a thickness approximately in the range of 50-100 Angstroms.

18. The semiconductor device of claim 11, wherein the gate dielectric layer is a high-k gate dielectric layer, and the gate electrode is a metal gate electrode.

19. A semiconductor structure, comprising:
a first semiconductor device, comprising:
a first vertical arrangement of a plurality of nanowires disposed above a substrate, each nanowire comprising an inner region having a first band gap and an outer cladding layer surrounding the inner region, the cladding layer having a second, narrower band gap;
a first gate stack disposed on and completely surrounding a channel region of each of the nanowires, the first gate stack comprising a gate dielectric layer disposed on and surrounding the cladding layer and a gate electrode disposed on the gate dielectric layer; and
source and drain regions disposed on either side of the channel regions of the nanowires of the first vertical arrangement of the plurality of nanowires; and
a second semiconductor device, comprising:
a second vertical arrangement of a plurality of nanowires disposed above the substrate;
a second gate stack disposed on and completely surrounding a channel region of each of the nanowires, the second gate stack comprising a gate dielectric layer and a gate electrode disposed on the gate dielectric layer; and
source and drain regions disposed on either side of the channel regions of the nanowires of the second vertical arrangement of the plurality of nanowires.

20. The semiconductor structure of claim 19, wherein the first semiconductor device is an NMOS device, and the second semiconductor device is a PMOS device.

21. The semiconductor structure of claim 20, wherein the cladding layer and inner region form a group III-V material hetero-junction.

22. The semiconductor structure of claim 19, wherein each nanowire of the second semiconductor device comprises a second inner region having a first band gap and a second outer cladding layer surrounding the second inner region, the second cladding layer having a second, narrower band gap.

23. The semiconductor structure of claim 22, wherein the cladding layer and the second cladding layer each comprises a material suitable to propagate a wave-function with low resistance.

24. The semiconductor structure of claim 23, wherein the inner region and the second inner region each comprises a material suitable to substantially prevent current flow from respective source regions to drain regions.

25. The semiconductor structure of claim 22, wherein material pairs of the cladding layer and inner region are selected from the group consisting of InGaAs/InP, GaAs/AlGaAs and InSb/AlInSb, and wherein the second cladding layer is germanium-rich and the second inner region is silicon-rich.

26. The semiconductor structure of claim 22, wherein each of the cladding layer and the second cladding layer has a thickness suitable to propagate a substantial portion of a wave-function and to inhibit a significant portion of the wave-function from entering the inner region and second inner region, respectively.

27. The semiconductor structure of claim 26, wherein each of the cladding layer and the second cladding layer has a thickness approximately in the range of 50-100 Angstroms.

28. The semiconductor structure of claim 19, wherein the gate dielectric layer of the first gate stack is a high-k gate dielectric layer, and the gate electrode of the first gate stack is an N-type metal gate electrode, and wherein the gate dielectric layer of the second gate stack is a high-k gate dielectric layer, and the gate electrode of the second gate stack is a P-type metal gate electrode.

29. A semiconductor device, comprising:
a hetero-structure disposed above a substrate and comprising a three-dimensional semiconductor body with a channel region comprising an inner region having a first band gap and an outer cladding layer at least partially surrounding the inner region, the cladding layer having a second, narrower band gap, the three-dimensional semiconductor body horizontally oriented with respect to the substrate;
a gate stack disposed on and at least partially surrounding the channel region, the gate stack comprising a gate dielectric layer disposed on the cladding layer and a gate electrode disposed on the gate dielectric layer, wherein the cladding layer completely surrounds the inner region of the channel region, and the gate stack completely surrounds the channel region; and
source and drain regions disposed in the three-dimensional semiconductor body, on either side of channel region.

30. The semiconductor device of claim 29, wherein material pairs of the cladding layer and inner region are selected from the group consisting of InP/InGaAs, GaAs/AlGaAs and AlInSb/InSb.

31. The semiconductor device of claim 29, wherein the cladding layer is germanium-rich and the inner region is silicon-rich.

* * * * *